(12) United States Patent
MacDonald, Jr. et al.

(10) Patent No.: US 6,184,570 B1
(45) Date of Patent: Feb. 6, 2001

(54) INTEGRATED CIRCUIT DIES INCLUDING THERMAL STRESS REDUCING GROOVES AND MICROELECTRONIC PACKAGES UTILIZING THE SAME

(75) Inventors: James D. MacDonald, Jr.; Rahul Gupta, both of Apex, NC (US)

(73) Assignee: Ericsson Inc., Research Triangle Park, NC (US)

( * ) Notice: Under 35 U.S.C. 154(b), the term of this patent shall be extended for 0 days.

(21) Appl. No.: 09/428,861

(22) Filed: Oct. 28, 1999

(51) Int. Cl.[7] .................................................. H01L 29/06
(52) U.S. Cl. ........................... 257/622; 257/618; 257/778
(58) Field of Search ................................. 257/622, 623, 257/625, 624, 778, 618, 621, 619

(56) References Cited

U.S. PATENT DOCUMENTS

| | | |
|---|---|---|
| 3,648,131 * | 3/1972 | Stuby . |
| 4,672,415 * | 6/1987 | Bernes et al. . |
| 4,951,099 * | 8/1990 | Berenz et al. . |
| 5,084,750 * | 1/1992 | Adlerstein . |
| 5,598,036 | 1/1997 | Ho ........................................ 257/738 |
| 5,635,762 * | 6/1997 | Gamand . |
| 5,677,564 * | 10/1997 | McCormack et al. . |
| 5,690,270 | 11/1997 | Gore .................................. 228/180.22 |
| 5,744,974 | 4/1998 | Notohardjono et al. .............. 324/760 |
| 5,804,771 | 9/1998 | McMahon et al. ................... 174/255 |

* cited by examiner

Primary Examiner—Sheila V. Clark
(74) Attorney, Agent, or Firm—Myers Bigel Sibley & Sajovec

(57) ABSTRACT

An integrated circuit includes an integrated circuit die having first and second opposing faces, a plurality of spaced apart bonding regions on the first face, and at least one groove in the second face. The at least one groove allows the die to flex upon application of stress to the bonding regions due to thermal cycling of the integrated circuit die, compared to absence of the at least one groove. Preferably, multiple grooves are provided, a respective one of which extends between a respective pair of adjacent spaced apart bonding regions. The grooves may be fabricated by sawing and/or etching the grooves in the second face. The sawing and/or etching may be performed at the wafer stage, before the integrated circuit dies are singulated. Alternatively, the sawing and/or etching may take place after the integrated circuit dies are singulated from the wafer.

41 Claims, 7 Drawing Sheets

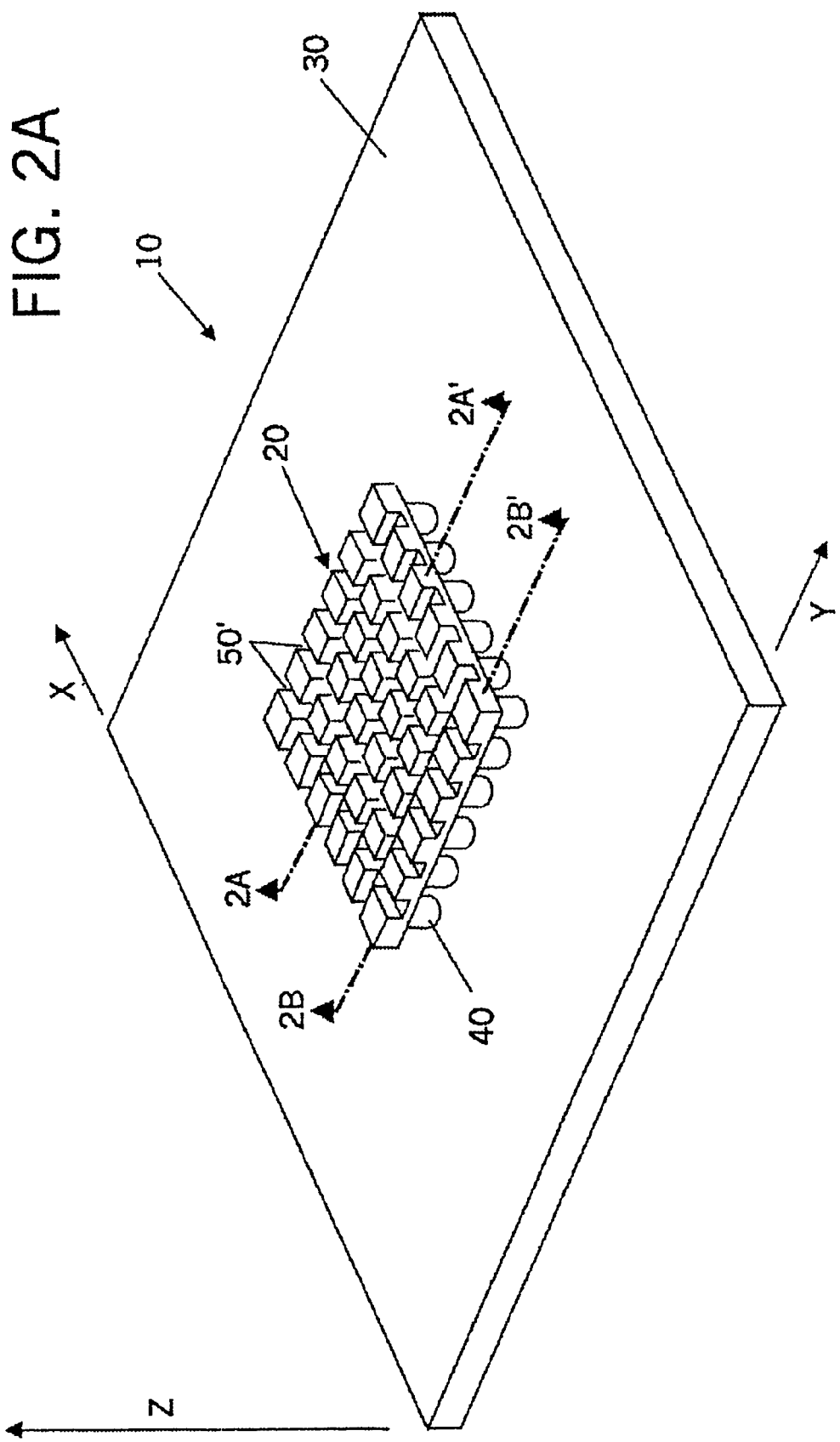

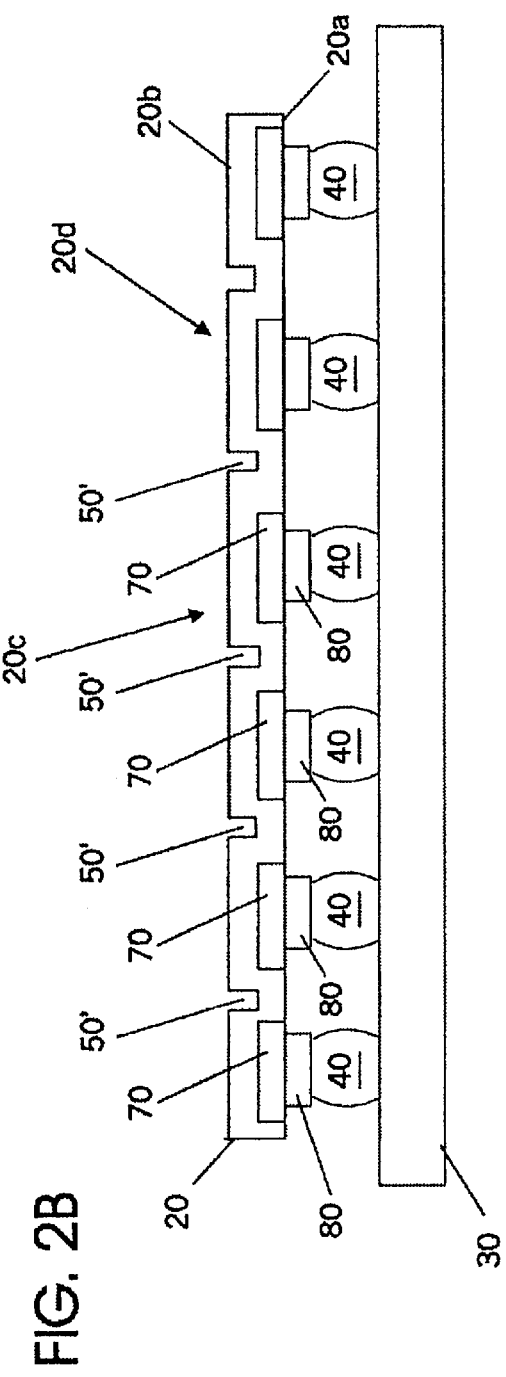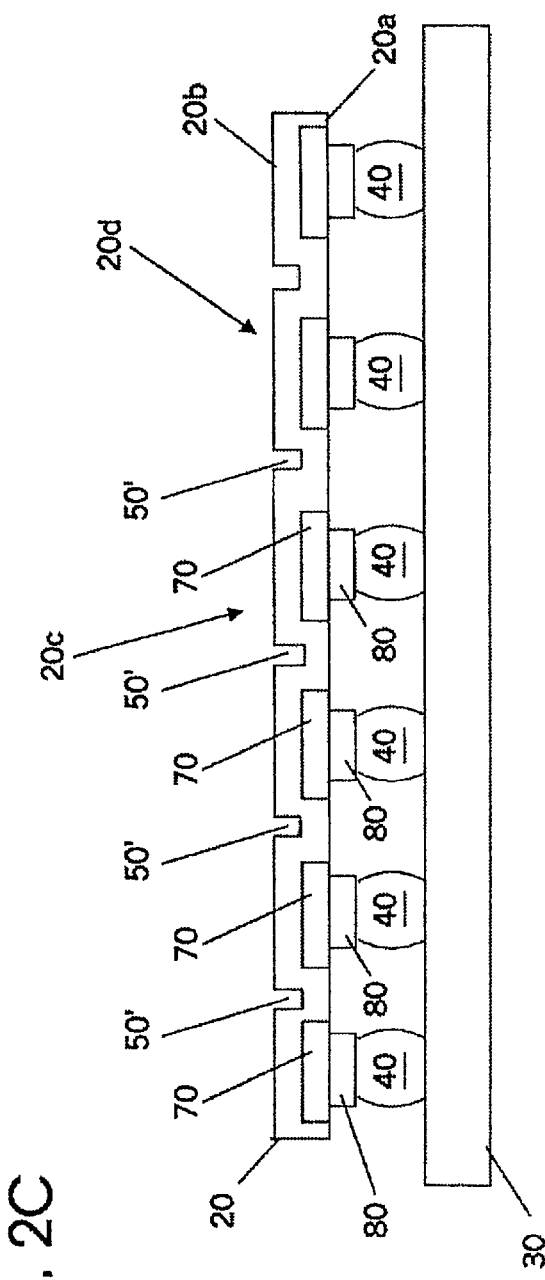

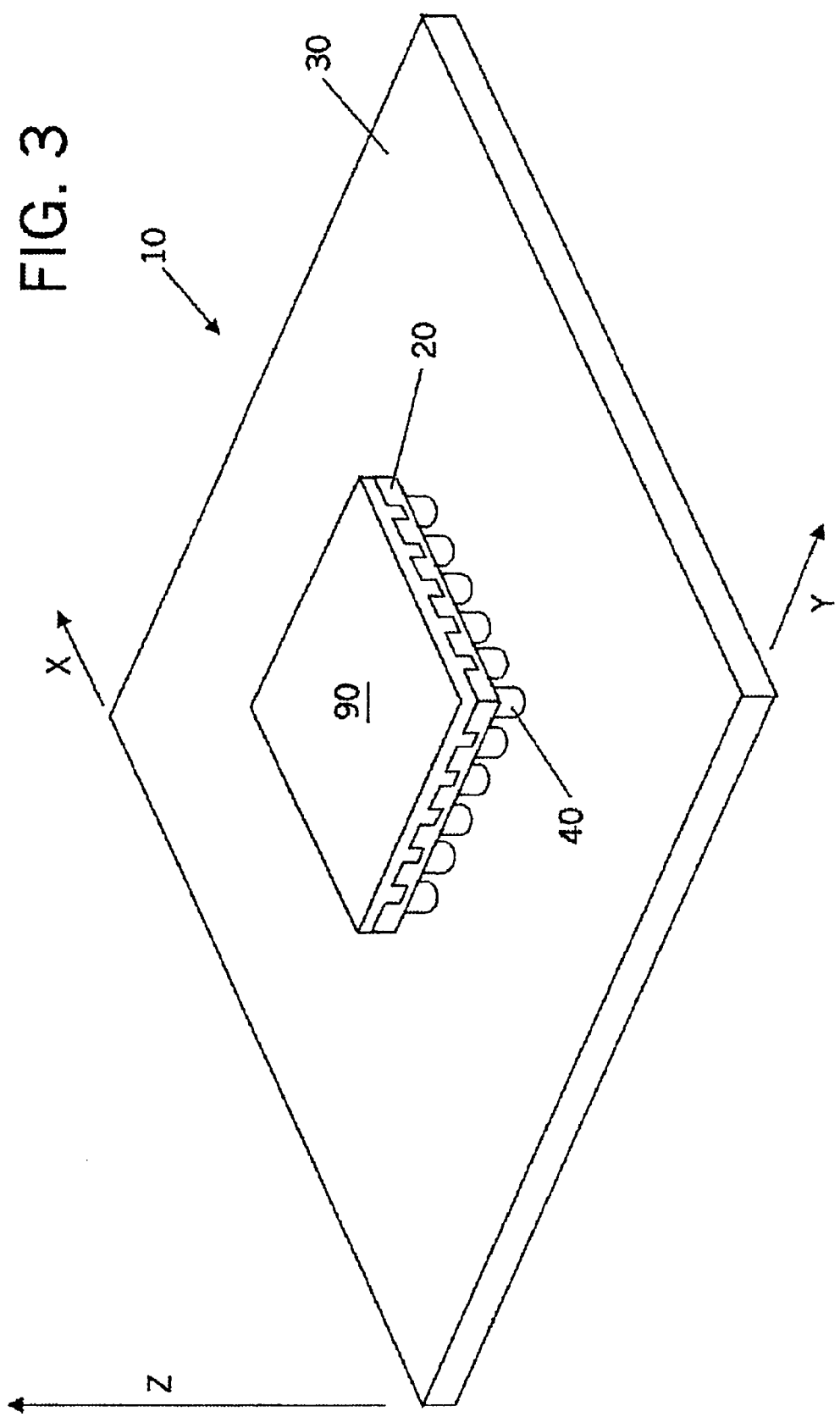

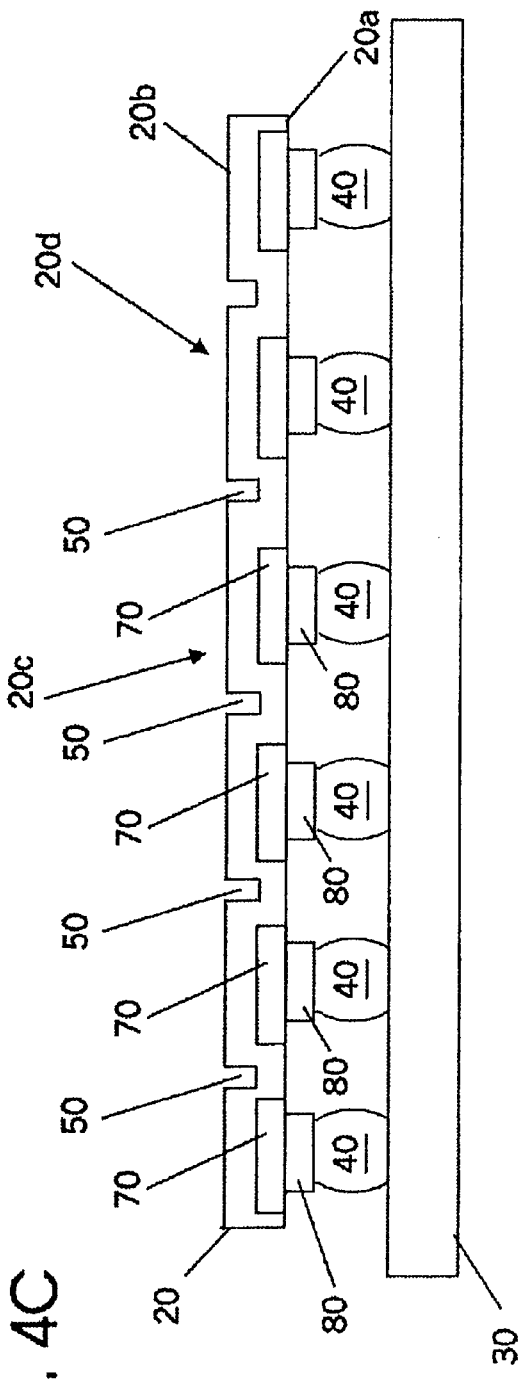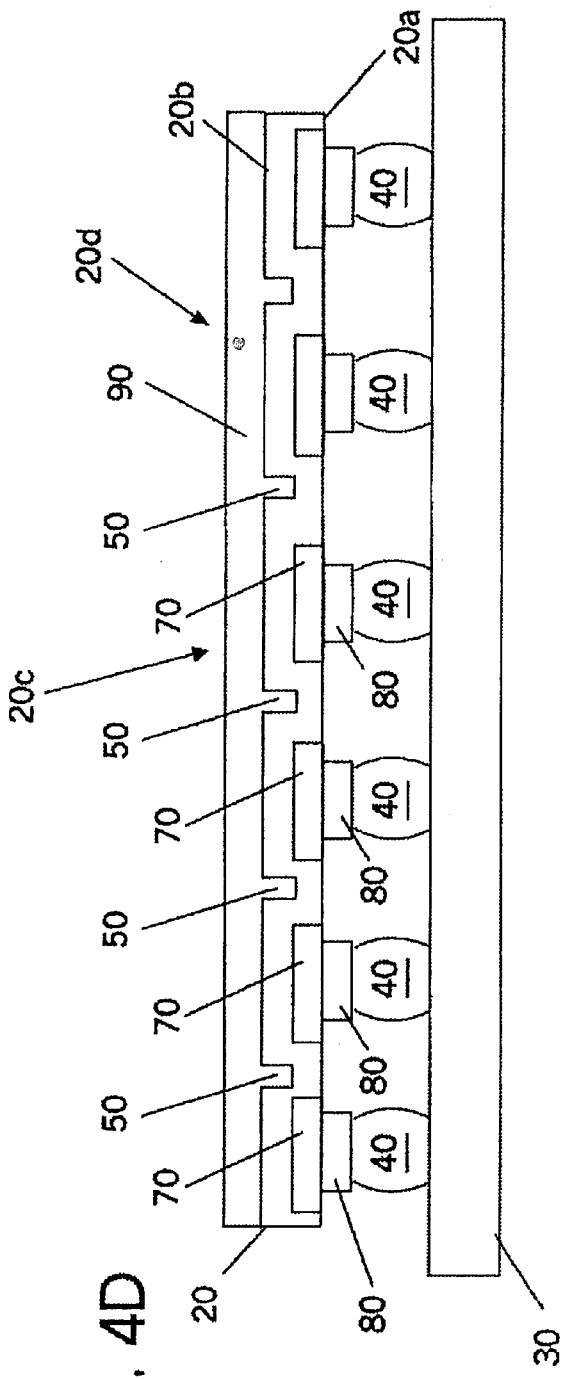

US 6,184,570 B1

INTEGRATED CIRCUIT DIES INCLUDING THERMAL STRESS REDUCING GROOVES AND MICROELECTRONIC PACKAGES UTILIZING THE SAME

FIELD OF THE INVENTION

This invention relates to microelectronic devices and related fabrication methods, and more particularly to packaging of microelectronic devices and related fabrication methods.

BACKGROUND OF THE INVENTION

Integrated circuits are widely used in consumer and commercial applications. As is well known to those having skill in the art, an integrated circuit generally includes an integrated circuit die such as a silicon semiconductor die, having first and second opposing faces. Microelectronic devices such as transistors are formed in the integrated circuit die adjacent the first face. A plurality of spaced apart bonding regions such as pads also are formed on the first face to allow electrical connection of the microelectronic devices to external of the integrated circuit die.

As the integration density of integrated circuit devices continues to increase, increasing demands may be placed on the packaging thereof. In particular, it may be desirable to provide large numbers of input/output connections for the integrated circuit device in order to provide power, control, signal, data, and other connections. Moreover, as the integration density continues to increase, the thermal management of the integrated circuit may become increasingly difficult, in order to dissipate the heat that is generated during the operation of the integrated circuit.

In order to accommodate these high performance input/output connection and thermal management needs, a variety of packages have been developed for packaging integrated circuit dies. In order to provide large numbers of input/output connections, many of these packages use solder bumps to connect the bonding regions to a mounting substrate, also referred to as a second level package. Examples of packaging technologies using solder bumps include "flip chip" technology, also referred to as Controlled Collapsed Chip Connection (C-4). Another packaging technology that uses solder bumps is referred to as Ball Grid Array (BGA) technology. These technologies are well known to those having skill in the art and need not be described further herein.

A major problem in microelectronic packaging using solder bumps is the reliability problems that may be introduced due to thermal cycling of the integrated circuit die. In particular, since the integrated circuit die generally has a different co-efficient of thermal expansion than the mounting substrate, stresses may be placed on the bonding regions and/or on the solder bumps that mechanically connect the bonding regions of the integrated circuit die with the mounting substrate, during thermal cycling of the integrated circuit die. These thermal stresses may eventually fatigue the solder bump and/or the connection with the bonding regions and/or the mounting substrate, which can lead to early failure of the microelectronic package.

Many attempts have been made to reduce the thermal stress on solder bumps and/or bonding regions due to thermal cycling. For example, U.S. Pat. No. 5,598,036 to Ho entitled Ball Grid Array Having Reduced Mechanical Stress describes the use of two sets of solder joints that have different melting points to thereby minimize the level of internal mechanical stress. U.S. Pat. NO. 5,690,270 to Gore entitled Surface Mounting Stress Relief Device and Method describes a pin that is coupled to an integrated circuit and that loosely fits within a feedthrough in a printed circuit board so that movement caused by a coefficient of thermal expansion mismatch between materials of the pin and printed circuit board is absorbed by movement of the pin within the feedthrough. U.S. Pat. No. 5,744,975 to Notohardjono, et al. entitled Enhanced Defect Elimination Process for Electronic Assemblies via Application of Sequentially Combined Multiple Stress Processes describes a method for combining three sequential test steps into a single stress test in order to screen microelectronic packages. Finally, U.S. Pat. No. 5,804,771 to McMahon et al. entitled Organic Substrate (PCB) Slip Plan "Stress Deflector" for Flip Chip Devices describes a layer on a substrate that allows an integrated circuit to float and expand at a different rate than the substrate when the package is thermally cycled.

Unfortunately, these and other stress reduction systems and methods may complicate the manufacture and/or increase the cost of the integrated circuit die and/or the microelectronic package. Accordingly, there continues to be a desire for stress reduction techniques that need not unduly complicate the manufacture of the integrated circuit die and/or the microelectronic package and need not unduly increase the cost thereof.

SUMMARY OF THE INVENTION

It therefore is an object of the present invention to provide improved integrated circuit dies, microelectronic packages and fabrication methods thereof.

It is another object of the present invention to provide improved thermal stress reducing structures and methods for integrated circuit dies and microelectronic packages.

It is still another object of the present invention to provide thermal stress reducing structures and methods for integrated circuit dies and microelectronic packages that need not unduly increase the cost and/or complexity and/or fabrication complexity of the integrated circuit dies and/or microelectronic packages.

These and other objects may be provided according to the present invention by an integrated circuit that includes an integrated circuit die having first and second opposing faces, a plurality of spaced apart bonding regions on the first face, and at least one groove in the second face. The at least one groove allows the die to flex upon application of stress to the bonding regions due to thermal cycling of the integrated circuit die, compared to absence of the at least one groove. Preferably, a plurality of grooves are provided, a respective one of which extends between a respective pair of adjacent spaced apart bonding regions. In one embodiment, the integrated circuit die may be about 0.6 mm thick and the grooves may be about 0.5 mm deep.

As is well known to those having skill in the art, the faces of an integrated circuit die generally include a central portion and a peripheral portion. In a peripheral ball grid array device, the plurality of spaced apart bonding regions extend along the peripheral portion but may not extend into the central portion. According to the invention, a respective groove preferably extends from an end of the first face across the peripheral portion. In contrast, in a flip chip device, wherein the spaced apart bonding regions are located in the peripheral portion and in the central portion, a respective groove preferably extends across the first face, including across the peripheral portion and across the central portion.

In order to enhance thermal conduction from the integrated circuit die, a thermally conductive material may be placed in the groove and/or on the second face. Other conventional thermal conduction techniques may be used to conduct heat from the second face. In fact, by providing greater surface area, the grooves may improve the thermal conduction from the die in an air, liquid, or other fluid-cooled environment.

Integrated circuit dies according to the present invention may be packaged by providing a plurality of solder bumps, a respective one of which is mechanically attached to a respective bonding region. A mounting substrate is mechanically attached to the plurality of solder bumps, opposite the bonding regions. A thermal conduction structure also may be thermally connected to the second face to conduct heat away from the second face.

The grooves may be fabricated, according to the invention, by sawing and/or etching the grooves in the second face. The sawing and/or etching may be performed at the wafer stage, before the integrated circuit dies are singulated. Alternatively, the sawing and/or etching may take place after the integrated circuit dies are singulated from the wafer.

By forming at least one groove in the second face of an integrated circuit die, the die can flex upon application of stress to the bonding regions of the die due to thermal cycling of the die. The grooves may be formed by etching and/or sawing without requiring complex structures in the microelectronic package and without the need to unduly complicate the fabrication process for the die and/or the microelectronic package. Improved reliability thereby may be provided without the need to unduly increase cost and/or complexity.

BRIEF DESCRIPTION OF THE DRAWINGS

FIG. 2A is a perspective view of other integrated circuits and microelectronic packages according to the present invention.

FIGS. 2B and 2C are side cross-sectional views taken along the lines 2B–2B' and 2C–2C', respectively, of FIG. 2A.

FIG. 3 is a perspective view of yet other integrated circuits and microelectronic packages according to the present invention.

FIGS. 4A–4D are cross-sectional views illustrating fabrication of integrated circuit dies and microelectronic packages according to the present invention.

DETAILED DESCRIPTION OF PREFERRED EMBODIMENTS

Figure 1A:
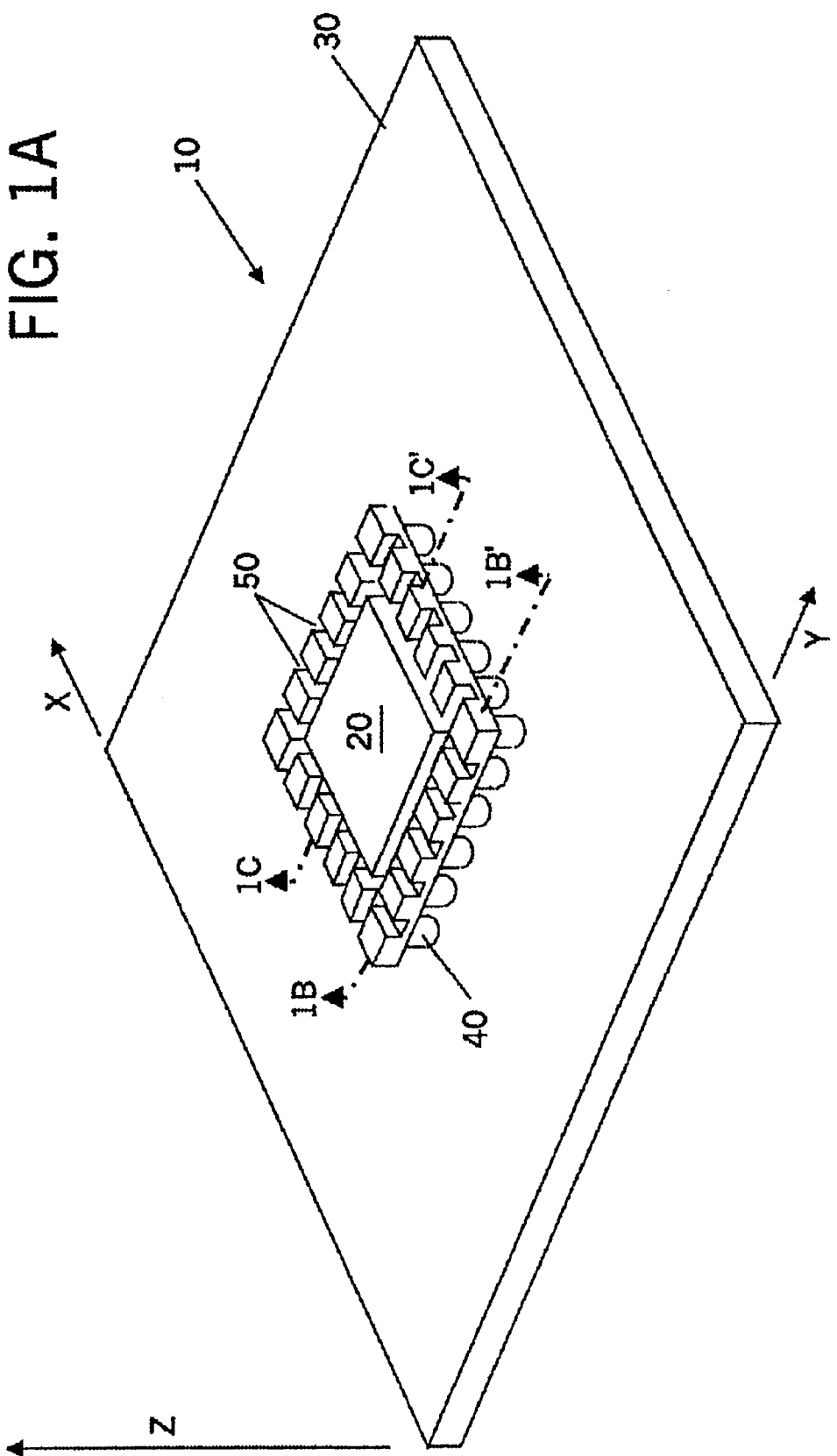
FIG. 1A is a perspective view of integrated circuits and microelectronic packages according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Similarly, when an element is referred to as being "connected" to another element, it can be directly connected to the other element or intervening elements may also be present. In contrast, when an element is referred to as being "directly connected" to another element, there are no intervening elements present.

Figure 1B:
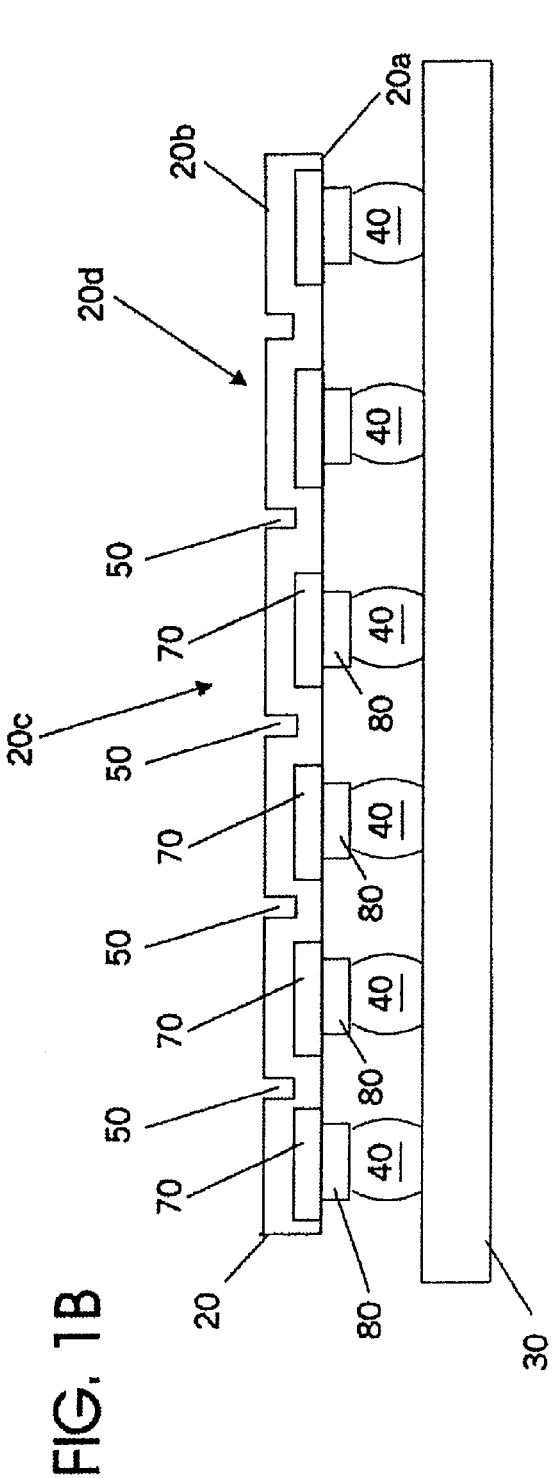
FIGS. 1B and 1C are side cross-sectional views taken along the lines 1B–1B' and 1C–1C', respectively, of FIG. 1A.
Figure 1C:
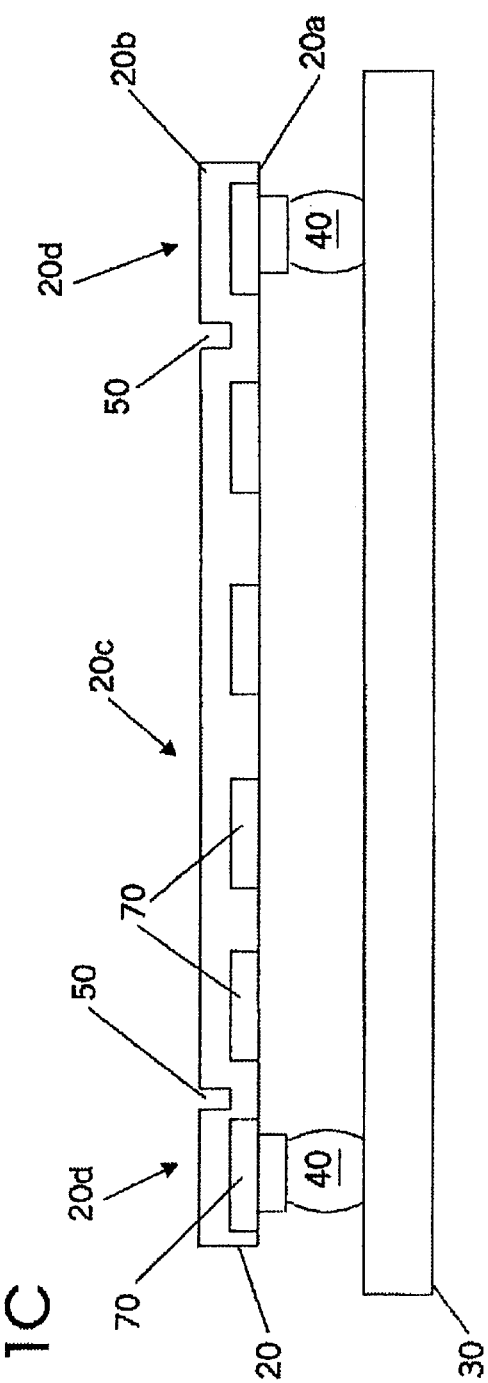

Referring now to FIGS. 1A, 1B, and 1C, first embodiments of integrated circuits and microelectronic packages according to the present invention are illustrated. FIG. 1A is a perspective view, and FIGS. 1B and 1C are side-cross sectional views taken along the lines 1B–1B' and 1C–1C', respectively. As shown in FIGS. 1A–1C, microelectronic packages 10 include an integrated circuit die 20, a mounting substrate 30, and a plurality of solder bumps 40 between the integrated circuit die 20 and the mounting substrate 30. At least one groove 50 is formed in a second face of the integrated circuit die 20, opposite the mounting substrate 30. The at least one groove 50 allows the die 20 to flex upon application of stress due to thermal cycling of the integrated circuit die, compared to absence of the grooves 50.

More specifically, FIGS. 1A–1C illustrate a peripheral array of solder bumps 40 such as may be used in peripheral Ball Grid Array (BGA) technology. The integrated circuit die 20 includes first and second opposing faces 20a and 20b, respectively. The integrated circuit die 20 may be fabricated of monocrystalline silicon, gallium nitride, gallium arsenite, silicon carbide, and/or other semiconductor materials. The substrate may be a monolithic substrate or may include an active substrate on a supporting substrate, including but not limited to Semiconductor-on-Insulator (SOI) substrates.

A plurality of microelectronic devices 70 are formed in the microelectronic substrate 20 adjacent the first face 28 thereof. The microelectronic devices 70 may include active devices such as field effect transistors, passive devices such as capacitors, other devices, and/or combinations thereof. The integrated circuit die 20 also includes a plurality of spaced apart bonding regions 80 on the first face 20a, at least some of which are electrically connected to the microelectronic devices 70 in the substrate 20.

It will be understood that although discrete bonding pads are illustrated in FIGS. 1A–1C for bonding regions 80, other configurations including recesses and/or pins may be used. Moreover, solder masks and/or other conventional techniques may be used to define spaced apart areas on the first face 20a of the integrated circuit die 20 as bonding regions 80. The design and fabrication of an integrated circuit die 20 as described above, except for the grooves 50, are well known to those having skill in the art and need not be described further herein.

Continuing with the description of FIGS. 1A–1C, a mounting substrate 30 also is provided. The mounting substrate may comprise a printed circuit board, multi-layer ceramic, glass ceramic, and/or other conventional microelectronic substrate, including a single wiring layer or multiple wiring layers. An array of solder bumps 40 connects the bonding regions 80 to the mounting substrate 30. The design and fabrication of mounting substrates 30 and solder bumps 40 are well known to those having skill in the art and need not be described further herein.

According to the invention, at least one groove 50 is provided in the second face 20b of the integrated circuit die 20. The at least one groove 50 allows the die 20 to flex upon application of stress to the bonding regions 80 due to thermal cycling of the integrated circuit die 20, compared to absence of the at least one groove. As shown in FIG. 1B, a plurality of grooves 50 preferably is provided, a respective one of which extends between a respective pair of adjacent spaced apart bonding regions 80. The grooves may have a depth of approximately 80% of the thickness of the die 20 between the first and second faces 20a and 20b. Accordingly, if a silicon die is 0.6 mm thick, the grooves may be 0.5 mm deep. It will be understood that although the grooves 50 are shown with vertical groove sidewalls and horizontal groove floors, they may include oblique sidewalls and/or floors. The sidewalls and/or floors of the grooves 50 also may be curved rather than linear, and the floors may be eliminated to provide V-shaped grooves 50.

In the embodiments of FIGS. 1A–1C, a peripheral array of bonding regions 80 and solder bumps 40 is shown such as may be used in peripheral BGA technology. More specifically, the integrated circuit die includes a central portion 20c and a peripheral portion 20d. The plurality of spaced apart bonding regions 80 extends along the peripheral portion 20d but not in the central portion 20c. As shown in FIGS. 1A–1C, for a peripheral array of bonding regions 80 and solder bumps 40, the grooves 50 preferably extend along the peripheral portion 20d from an end of the first face across the peripheral portion 20d. The grooves 50 preferably do not extend into the central portion 20c. However, the grooves may extend into the central portion 20c.

FIGS. 2A–2C illustrate an area array of bonding regions 80 and solder bumps 40 that are located in the peripheral portion 20d and in the central portion 20c of the integrated circuit die, as may be used in flip chip technology. In this embodiment, the grooves 50' preferably extend across the second face 20b including across the peripheral portion 20d and also extend across the central portion 20c. Alternatively, since most of the stress generally occurs in the peripheral portion 20b, the grooves may need not extend across the central portion 20c.

FIGS. 1A–1C and 2A–2C illustrate grooves 50 and 50' that are located between the spaced apart bonding regions 80. However, the grooves may be provided at other locations, for example, centered on the spaced apart bonding regions. In this case, the grooves may be shallower due to the reduced stresses that may be encountered.

FIG. 3 illustrates other embodiments of the invention in which a thermally conductive material 90 is included in the grooves 50 and preferably on the second face 20b as well. The thermally conductive material preferably enhances the thermal conduction from the integrated circuit die through the second face 20b. Exemplary thermally conductive materials may include high purity alumina and/or silica having thermal coefficients of expansion that match the die 20. These materials preferably should have a high degree of flexibility so as not to reduce the stress reducing action of the grooves 50. It also will be understood that the thermally conductive material 90 may form a portion of a thermal conduction structure that is thermally connected to the second face to conduct heat away from the second face. Thermal conduction structure may include heat sinks, pistons, encapsulated gas, liquid and/or other conventional thermal conduction elements that are well known to those having skill in the art and need not be described in detail herein.

Figure 4A:
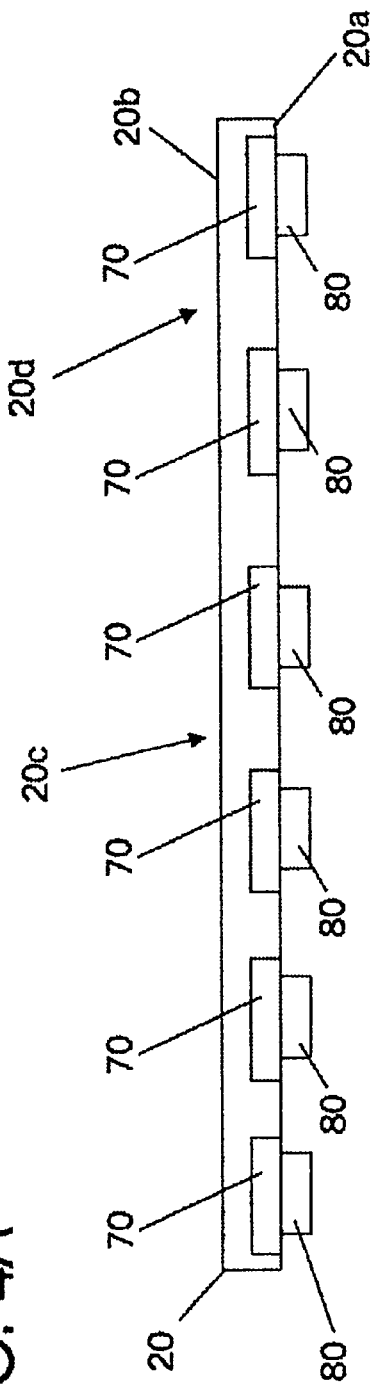

FIGS. 4A–4D are cross-sectional views illustrating fabrication of integrated circuit dies and microelectronic packages according to the present invention. As shown in FIG. 4A, an integrated circuit die is fabricated using conventional fabrication techniques to form microelectronic devices 70 and bonding regions in an integrated circuit die 20.

Figure 4B:
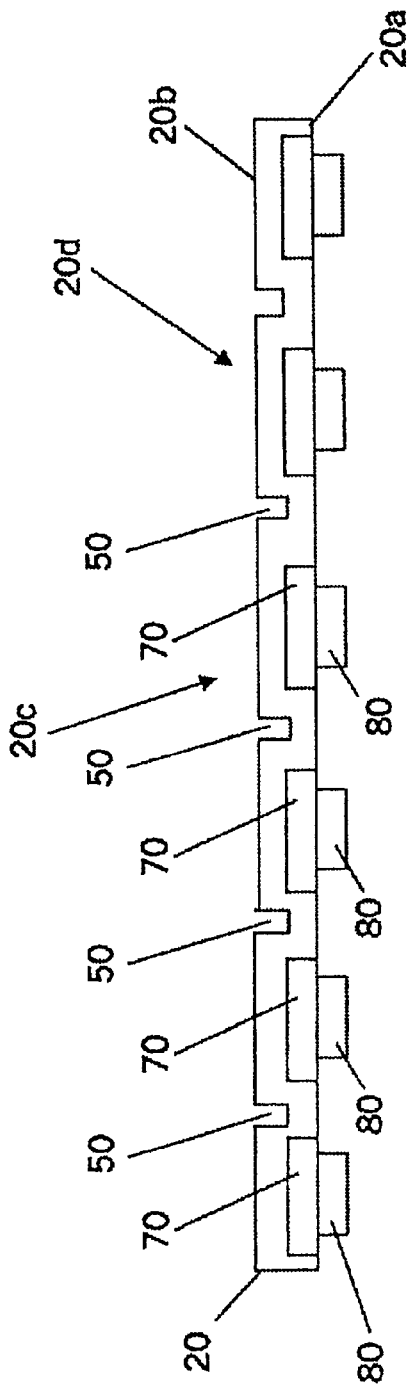

Then, referring to FIG. 4B, at least one groove 50 is formed in the second face 20b. It will be understood that the at least one groove 50 may be formed by sawing, etching, and/or other techniques. It also will be understood that the grooves 50 may be formed prior to forming the microelectronic devices 70 and/or the bonding regions 80 of FIG. 4A. Finally, it will be understood that the integrated circuit dies 20 generally are formed in a wafer and later singulated. Thus, the operations of FIG. 4A and 4B may take place at the wafer stage, after which the dies are singulated, rather than occurring on the individual dies as shown in FIGS. 4A and 4B.

Referring now to FIG. 4C, the integrated circuit die 20 is attached to the mounting substrate 30 using a plurality of solder bumps 40 that mechanically connect the bonding regions 80 to the mounting substrate 30. It will be understood that the solder bumps 40 initially may be formed on the integrated circuit die 20 and/or on the substrate 30 and then reflowed to attach the integrated circuit die to the mounting substrate 30. Finally, referring to FIG. 4D, a thermal conduction structure such as a thermally conductive material 90 is connected to the second face to conduct heat away from the second face. Other thermal conduction structures also may be used.

Accordingly, the grooves can reduce and preferably minimize the thermal stresses on the solder bumps, mounting regions and/or the integrated circuit die. The reliability and/or lifetime of the integrated circuit die and/or microelectronic package thereby can be increased and preferably maximized.

In order to verify a reduction in thermal stress according to the present invention, four different cases were simulated using Finite Element Analysis (FEA) to study the effect of thermal stresses. Case 1 illustrates a 0.6 mm silicon die as shown in FIG. 1A but without the grooves 50. Case 2 illustrates a 0.6 mm silicon die with 0.5 mm grooves 50 according to the present invention as shown in FIG. 1A. Case 3 illustrates a 0.6 mm silicon die of FIG. 1A including the grooves 50, topped with 0.2 mm of high modulus thermally conductive alumina filled epoxy. Finally, Case 4 illustrates a 0.2 mm silicon die without grooves. The results are tabulated in the following Table.

TABLE

| Stress (psi) | Case 1 Full model | Case 2 Full model | % diff | Case 3 Full model | % diff | Case 4 Full model | % diff |
|---|---|---|---|---|---|---|---|
| σ (vms) | 21738 | 18342 | (−) 16 | 28513 | (+) 31 | 19029 | (−) 13 |
| σ (z) | 18368 | 12085 | (−) 34 | 20891 | (+) 14 | 8989 | (−) 51 |

TABLE-continued

|        | Case 1 | Case 2 |       | Case 3 |       | Case 4 |        |
| ------ | ------ | ------ | ----- | ------ | ----- | ------ | ------ |
| σ (x)  | 12543  | 13133  | (+) 5 | 12959  | (+) 3 | 11733  | (−) 7  |
|        | Solder layer | Solder layer | % diff | Solder layer | % diff | Solder layer | % diff |
| σ(vms) | 20111  | 15455  | (−) 23 | 21608 | (+) 7 | 14319 | (−) 29 |
| σ (z)  | 43026  | 22419  | (−) 48 | 46005 | (+) 7 | 18600 | (−) 57 |
| σ (x)  | 47873  | 33330  | (−) 30 | 48250 | (+) 1 | 30923 | (−) 35 |

In the above Table, σ (vms) indicates Von Mises Stress which can provide an indication of overall stress. Also, σ (z) indicates stress along the z axis shown in FIGS. 1A and 2A, while σ (x) illustrates stress along the x axis of FIGS. 1A and 2A. Full model indicates stress over the entire microelectronic package, solder layer indicates stress over the solder bumps, and % diff is the percentage difference relative to Case 1.

A comparison of Case 1 and Case 2 shows a significant stress reduction may be achieved by providing grooves according to the present invention. The results are comparable to the base line model Case 4 with a 0.2 mm silicon die. The TCE layer to fill the grooves in Case 3 illustrates that high modulus epoxy may be a poor choice for a thermal conduction structure for filling the grooves because the stresses go much higher than Case 1 and do not appear to offer any benefits. Accordingly, a flexible thermal conduction structure that fills the grooves should be selected as was previously described.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
   an integrated circuit die including first and second opposing faces;
   a plurality of spaced apart bonding regions on the first face; and
   at least one groove in the second face that allows the die to flex upon application of stress to the bonding regions due to thermal cycling of the integrated circuit die, compared to absence of the at least one groove.

2. An integrated circuit comprising:
   an integrated circuit die including first and second opposing faces;
   a plurality of spaced apart bonding regions on the first face; and
   a plurality of grooves in the second face, a respective one of which extends between a respective pair of adjacent spaced apart bonding regions.

3. An integrated circuit according to claim 2 wherein the first and second faces include a central portion and a peripheral portion, wherein the plurality of spaced apart bonding regions extend along the peripheral portion, and wherein a respective groove extends from an end of the second face, across the peripheral portion.

4. An integrated circuit according to claim 2 wherein the first and second faces include a central portion and a peripheral portion, wherein the plurality of spaced apart bonding regions are located in the peripheral portion and in the central portion, and wherein a respective groove extends across the second face, including across the peripheral portion and across the central portion.

5. An integrated circuit according to claim 1 further comprising:
   a thermally conductive material in the at least one groove.

6. An integrated circuit according to claim 5 wherein the thermally conductive material is on the second face and in the at least one groove.

7. An integrated circuit according to claim 1 further comprising:
   a plurality of solder bumps, a respective one of which is mechanically attached to a respective bonding region.

8. An integrated circuit according to claim 7 in combination with a mounting substrate that is mechanically attached to the plurality of solder bumps, opposite the bonding regions.

9. An integrated circuit comprising:
   an integrated circuit die including first and second opposing faces;
   a plurality of spaced apart bonding regions on the first face; and
   at least one groove in the second face;
      wherein the integrated circuit die is about 0.6 mm thick between the first and second opposing faces and wherein the at least one groove is about 0.5 mm deep.

10. A microelectronic package comprising:
    an integrated circuit die including first and second opposing faces, a plurality of spaced apart bonding regions on the first face, and at least one groove in the second face that allows the die to flex upon application of stress to the bonding regions due to thermal cycling of the integrated circuit die, compared to absence of the at least one groove;
    a plurality of solder bumps, a respective one of which is mechanically attached to a respective bonding region; and
    a mounting substrate that is mechanically attached to the plurality of solder bumps, opposite the bonding regions.

11. A microelectronic package comprising:
    an integrated circuit die including first and second opposing faces, a plurality of spaced apart bonding regions on the first face, and
    a plurality of grooves in the second face, a respective one of which extends between a respective pair of adjacent spaced apart bonding regions;
    a plurality of solder bumps, a respective one of which is mechanically attached to a respective bonding region; and
    a mounting substrate that is mechanically attached to the plurality of solder bumps, opposite the bonding regions.

12. A microelectronic package according to claim 11 wherein the first and second faces include a central portion and a peripheral portion, wherein the plurality of spaced apart bonding regions extend along the peripheral portion, and wherein a respective groove extends from an end of the second face, across the peripheral portion.

13. A microelectronic package according to claim 11 wherein the first and second faces include a central portion and a peripheral portion, wherein the plurality of spaced apart bonding regions are located in the peripheral portion and in the central portion, and wherein a respective groove extends across the second face, including across the peripheral portion and across the central portion.

14. A microelectronic package according to claim 10 further comprising:
   a thermal conduction structure that is thermally connected to the second face to conduct heat away from the second face.

15. A microelectronic package according to claim 14 wherein the thermal conduction structure comprises a thermally conductive material in the at least one groove.

16. A microelectronic package according to claim 15 wherein the thermally conductive material is on the second face and in the at least one groove.

17. A microelectronic package comprising:
   an integrated circuit die including first and second opposing faces, a plurality of spaced apart bonding regions on the first face, and at least one groove in the second face;
   a plurality of solder bumps, a respective one of which is mechanically attached to a respective bonding region; and
   a mounting substrate that is mechanically attached to the plurality of solder bumps, opposite the bonding regions;
      wherein the integrated circuit die is about 0.6 mm thick between the first and second opposing faces and wherein the at least one groove is about 0.5 mm deep.

18. An integrated circuit according to claim 2 wherein the plurality of grooves allow the die to flex upon application of stress to the bonding regions due to thermal cycling of the integrated circuit die, compared to absence of the plurality of grooves.

19. An integrated circuit according to claim 2 further comprising:
   a thermally conductive material in the plurality of grooves.

20. An integrated circuit according to claim 19 wherein the thermally conductive material is on the second face and in the plurality of grooves.

21. An integrated circuit according to claim 2 further comprising:
   a plurality of solder bumps, a respective one of which is mechanically attached to a respective bonding region.

22. An integrated circuit according to claim 21 in combination with a mounting substrate that is mechanically attached to the plurality of solder bumps, opposite the bonding regions.

23. An integrated circuit according to claim 9 wherein the at least one groove allows the die to flex upon application of stress to the bonding regions due to thermal cycling of the integrated circuit die, compared to absence of the at least one groove.

24. An integrated circuit according to claim 9 wherein the at least one groove comprises a plurality of grooves, a respective one of which extends between a respective pair of adjacent spaced apart bonding regions.

25. An integrated circuit according to claim 24 wherein the first and second faces include a central portion and a peripheral portion, wherein the plurality of spaced apart bonding regions extend along the peripheral portion, and wherein a respective groove extends from an end of the second face, across the peripheral portion.

26. An integrated circuit according to claim 24 wherein the first and second faces include a central portion and a peripheral portion, wherein the plurality of spaced apart bonding regions are located in the peripheral portion and in the central portion, and wherein a respective groove extends across the second face, including across the peripheral portion and across the central portion.

27. An integrated circuit according to claim 9 further comprising:
   a thermally conductive material in the at least one groove.

28. An integrated circuit according to claim 27 wherein the thermally conductive material is on the second face and in the at least one groove.

29. An integrated circuit according to claim 9 further comprising:
   a plurality of solder bumps, a respective one of which is mechanically attached to a respective bonding region.

30. An integrated circuit according to claim 29 in combination with a mounting substrate that is mechanically attached to the plurality of solder bumps, opposite the bonding regions.

31. A microelectronic package according to claim 10 wherein the plurality of grooves allow the die to flex upon application of stress to the bonding regions due to thermal cycling of the integrated circuit die, compared to absence of the plurality of grooves.

32. A microelectronic package according to claim 11 further comprising:
   a thermal conduction structure that is thermally connected to the second face to conduct heat away from the second face.

33. A microelectronic package according to claim 32 wherein the thermal conduction structure comprises a thermally conductive material in the at least one groove.

34. A microelectronic package according to claim 33 wherein the thermally conductive material is on the second face and in the at least one groove.

35. A microelectronic package according to claim 17 wherein the at least one groove allows the die to flex upon application of stress to the bonding regions due to thermal cycling of the integrated circuit die, compared to absence of the at least one groove.

36. A microelectronic package according to claim 17 wherein the at least one groove comprises a plurality of grooves, a respective one of which extends between a respective pair of adjacent spaced apart bonding regions.

37. A microelectronic package according to claim 36 wherein the first and second faces include a central portion and a peripheral portion, wherein the plurality of spaced apart bonding regions extend along the peripheral portion, and wherein a respective groove extends from an end of the second face, across the peripheral portion.

38. A microelectronic package according to claim 36 wherein the first and second faces include a central portion and a peripheral portion, wherein the plurality of spaced apart bonding regions are located in the peripheral portion and in the central portion, and wherein a respective groove extends across the second face, including across the peripheral portion and across the central portion.

39. A microelectronic package according to claim 17 further comprising:

a thermal conduction structure that is thermally connected to the second face to conduct heat away from the second face.

40. A microelectronic package according to claim 39 wherein the thermal conduction structure comprises a thermally conductive material in the at least one groove.

41. A microelectronic package according to claim 40 wherein the thermally conductive material is on the second face and in the at least one groove.

* * * * *